United States Patent [19]

Giolma et al.

[11] Patent Number: 5,453,680
[45] Date of Patent: Sep. 26, 1995

[54] CHARGE PUMP CIRCUIT AND METHOD

[75] Inventors: William Giolma, Dallas, Tex.; Srinivasan Venkatraman, Bangalore, Ind.

[73] Assignee: Texas Instruments Incorporated, Dallas, Tex.

[21] Appl. No.: 189,010

[22] Filed: Jan. 28, 1994

[51] Int. Cl.$^6$ ............................................. G05F 3/16
[52] U.S. Cl. ...................... 323/315; 327/536; 323/312
[58] Field of Search ................................. 323/312, 313, 323/314, 315, 274, 316, 538, 539, 543, 581

[56] References Cited

U.S. PATENT DOCUMENTS

| | | | |
|---|---|---|---|
| 4,706,013 | 11/1987 | Kuo | 323/316 |
| 4,713,560 | 12/1987 | Herndon | 307/455 |
| 4,825,142 | 4/1989 | Wang | 323/314 |
| 4,847,519 | 7/1989 | Wahl et al. | 307/296.2 |
| 5,153,530 | 10/1992 | Takagi et al. | 331/17 |
| 5,239,455 | 8/1993 | Fobbester et al. | 363/60 |
| 5,247,241 | 9/1993 | Ueda | 323/312 |

*Primary Examiner*—Peter S. Wong
*Assistant Examiner*—Adolf Berhane
*Attorney, Agent, or Firm*—Paul C. Hashim; W. James Brady; Richard L. Donaldson

[57] ABSTRACT

A charge pump (10) having a current source (12) and a current sink (14) is provided. Current source (12) generates one of two output currents using current mirror (16) and switch (18). Switch (18) selects between the two outputs based on a signal from source control (20). Current sink (14) generates one of two currents using current mirrors (44) and (46), and switch (48). Switch (48) selects from two currents generated by current mirrors (44) and (46).

20 Claims, 2 Drawing Sheets

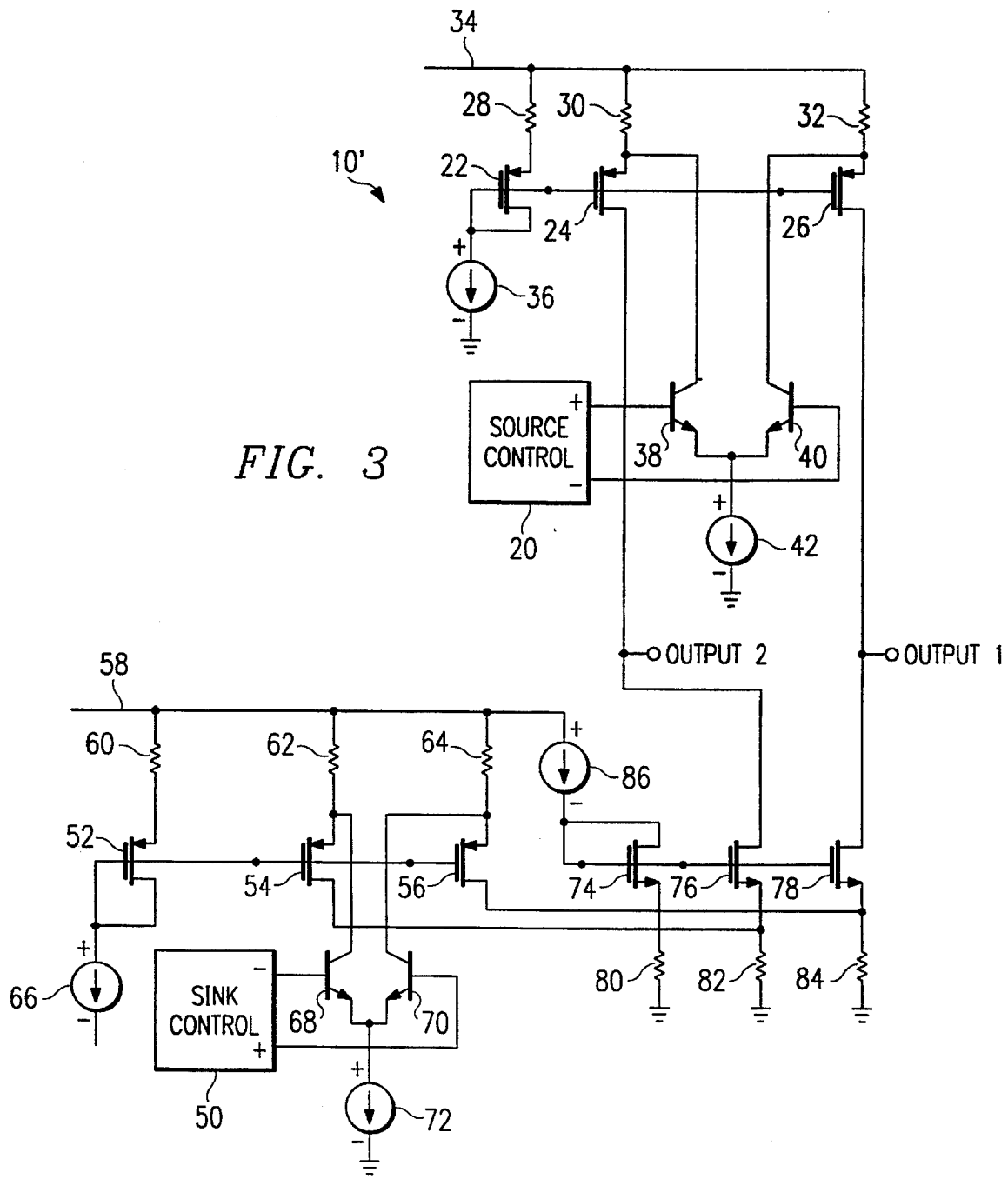

5,453,680

CHARGE PUMP CIRCUIT AND METHOD

TECHNICAL FIELD OF THE INVENTION

This invention relates in general to the field of electronic devices. More particularly, this invention relates to a charge pump circuit and method.

BACKGROUND OF THE INVENTION

A charge pump is an electronic circuit that comprises both a current source and a current sink. Therefore, a charge pump may provide current to, or receive current from an external system. There are many applications in electronics where a charge pump may be utilized. For example, a charge pump is commonly used in a phase lock loop circuit. Such a phase lock loop may be used, for example, in a read channel integrated circuit for a hard disk drive of a computer system.

Existing charge pump circuits and methods exhibit several disadvantages. First, the current source may operate more slowly than the current sink. Therefore, the transient response of the source and sink may not match. Existing current sources are typically fabricated using P-Channel transistors. Parasitic capacitance in the P-Channel transistors may cause the current source to operate more slowly than a current sink fabricated with complementary N-Channel transistors. A charge pump used in, for example, a phase lock loop, may need to have a current source that more closely matches the capabilities of the current sink. If the current source and current sink do not match, the phase lock loop may not operate properly. Finally, existing charge pumps may not provide a stable output current.

SUMMARY OF THE INVENTION

In accordance with the present invention, a charge pump system and method is provided which substantially eliminates or reduces disadvantages and problems associated with prior systems and methods. More particularly, one embodiment of the present invention provides a charge pump comprising a current source and a current sink. The current source comprises a circuit for generating first and second output currents and a switch. The switch has a differential input and is coupled to the generating circuit. The switch may select between the first and second output currents. The current sink comprises a circuit for generating first and second output currents, a circuit for generating third and fourth output currents, and a switch. The current sink switch has a differential input and may select between the first and second output currents. The second generating circuit outputs either the third or fourth output current based on the first and second output currents of the first generating circuit. Thereby, the charge pump may operate as a current source or a current sink.

A technical advantage of the present invention inheres in the fact that a current source constructed according to the teachings of the present invention may quickly change states. For example, the current source may have an "off" state wherein little or no current is supplied. Additionally, the current source may have an "on" state wherein a predetermined current is supplied. The current source may quickly change from an "off" state to an "on" state, or from an "on" state to an "off" state. The current source is controlled by a switch having a differential input. The differential control stabilizes the gate voltage of transistors in the current source and overcomes problems associated with parasitic capacitance between the source and gate of the transistors. The current source is also operable to provide an accurate final current due to the constant nature of the gate voltage.

Another technical advantage of the present invention inheres in the fact that it provides a current source that matches the current sink. Therefore, the charge pump of the present invention may be used in electronic circuits with stringent phase requirements. For example, the charge pump of the present invention may be properly utilized in a phase lock loop circuit. The present invention allows matching of the current source and current sink by incorporating the identical structure of the current source in the current sink. Typically, a current source is slower than a current sink. Therefore, by incorporating the current source into the current sink, the transient speeds of the current source and current sink are more closely matched.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 2 is a table indicating the output of a charge pump constructed according to the teachings of the present invention based on two separate control inputs; and FIG. 3 illustrates a second embodiment of a charge pump having a complimentary output and constructed according to the teachings of the present invention.

DETAILED DESCRIPTION OF THE INVENTION

Figure 1:
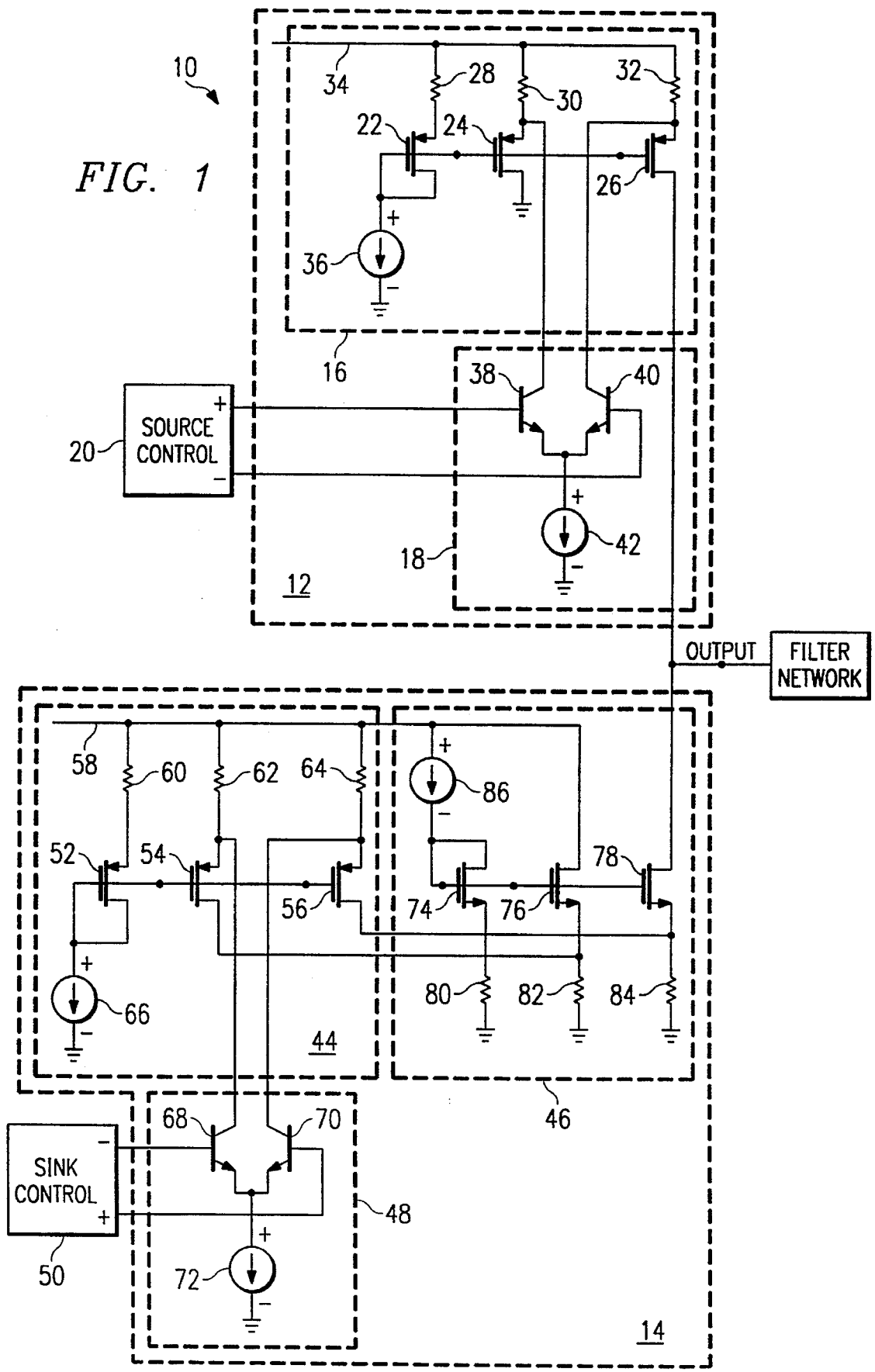
FIG. 1 illustrates an embodiment of a charge pump constructed according to the teachings of the present invention.

FIG. 1 is an embodiment of a charge pump indicated generally at 10 and constructed according to the teachings of the present invention. Charge pump 10 comprises a current source 12 and a current sink 14. Source 12 and sink 14 may comprise matched circuits such that source 12 switches output current values with substantially the same speed that sink 14 switches output current values. If source 12 and sink 14 are matched, charge pump 10 may appropriately be used in a phase lock loop circuit such as a circuit used in a high performance hard disk drive read-channel integrated circuit. Alternatively, charge pump 10 may be used in any other appropriate electronic device requiring a charge pump. Source 12 of charge pump 10 is designed for increased speed over conventional current sources.

Source 12 is operable to provide one of two predetermined current outputs. Source 12 creates the current output using current mirror 16 and switch 18. Source control 20 selects between the two predetermined outputs.

Current mirror 16 may comprise, for example, first, second and third transistors 22, 24, and 26, respectively. Transistors 22, 24, and 26 may comprise, for example, appropriate P-Channel MOSFET transistors or other appropriate transistors for use in a current mirror. A gate of each transistor 22, 24, and 26 may be coupled together. Furthermore, a source of each transistor 22, 24, and 26 may be coupled through resistors 28, 30, and 32, respectively, to a power source 34. The gate of transistor 22 may be coupled to a current source 36 and a drain of transistor 22. In this manner, transistor 22 may set a current for current mirror 16.

This current may be replicated in transistors 24 and 26. A drain of transistor 24 may be coupled to a ground potential. Finally, a drain of transistor 26 may comprise an output of current source 12.

Switch 18 may select between two predetermined currents of current mirror 16. Switch 18 may comprise, for example, first and second transistors 38 and 40. Transistors 38 and 40 may comprise, for example, NPN bipolar junction transistors or other appropriate transistors for use in a differential switch. A base of each transistor 38 and 40 may provide a differential input for switch 18. A base of transistor 38 may be coupled to a positive terminal of source control 20. A base of transistor 40 may be coupled to a negative terminal of source control 20.

Transistors 38 and 40 may be coupled in an emitter-coupled differential configuration as shown in FIG. 1. An emitter of each transistor 38 and 40 may be coupled together. The emitter of each transistor 38 and 40 may be coupled to ground potential through a current source 42. A collector of transistor 38 may be coupled to a source of transistor 24. Finally, a collector of transistor 40 may be coupled to a source of transistor 26. Thereby, transistors 22, 24, 26, 38 and 40 comprise a folded cascode configuration. In this manner, switch 18 provides differential control of current mirror 16.

In operation, a control signal is provided to current source 12 at switch 18 by source control 20. If the voltage applied at the positive terminal of source control 20 is greater than the voltage applied at the negative terminal of source control 20, current source 12 provides a predetermined, measurable output current. Transistor 38 is turned on due to a voltage drop between the base and emitter of transistor 38. Transistor 38 draws current through resistor 30 thereby turning off transistor 24. Transistor 40 is turned off because the base-emitter junction of transistor 40 is reverse biased. Therefore, current passes through resistor 32 and active device 26 to provide an output of current source 12. It is noted that throughout this description, a transistor is considered "on" if it conducts significant current between a collector and an emitter or between a source and a drain. Additionally, a transistor is considered "off" if it conducts, at a significantly lesser current between source and drain or between collector and emitter, than the transistor conducts in the on state.

Alternatively, if the voltage at the negative terminal of source control 20 is greater than the voltage at the positive terminal of source control 20, current source 12 may provide an output current approximately equal to zero or some other appropriate output. In this situation, transistor 40 is turned on and transistor 38 is turned off. Transistor 40 draws current from resistor 32 thereby turning off transistor 26. Therefore, current source 12 provides a current output of approximately zero amps.

Current sink 14 may comprise, for example, first current mirror 44, second current mirror 46, switch 48, and sink control circuit 50. As described below, current mirror 44 and switch 48 are designed to be substantially identical with current mirror 16 and switch 18 in order to equalize the speed at which source 12 and sink 14 operate. Current mirror 44 may comprise, for example, first, second, and third transistors 52, 54, and 56, respectively. Transistors 52, 54, and 56 may comprise P-Channel MOSFET transistors coupled in a folded cascode configuration as described above with respect to current mirror 16. A source of each transistor 52, 54 and 56 may be coupled to power supply 58 through resistors 60, 62 and 64, respectively. Finally, a gate of transistor 52 may be coupled to a ground potential through current source 66.

Switch 48 may control the current supplied by current mirror 44 to current mirror 46. Switch 48 may comprise, for example, first and second transistors 68 and 70, respectively. Transistors 68 and 70 may comprise, for example, NPN bipolar junction transistors or other appropriate transistors for use in a differential switch. A base of transistor 68 may be coupled to a positive terminal of sink control circuit 50. A base of transistor 70 may be coupled to a negative terminal of sink control circuit 50. An emitter of each transistor 68 and 70 may be coupled together. Finally, the emitter of each of transistors 68 and 70 may be coupled to a ground potential through a current source 72.

Second current mirror 46 may comprise, for example, first, second and third transistors 74, 76, and 78. Transistors 74, 76, and 78 may comprise; for example, N-Channel MOSFET transistors. Transistors 74, 76, and 78 along with transistors 54 and 56 may be coupled in a folded cascode configuration. A gate of each of transistors 74, 76, and 78 may be coupled together. A source of each transistor 74, 76, and 78 may be coupled to a ground potential through resistors 80, 82, and 84, respectively. A drain of transistor 74 may be coupled to the gate of transistor 74. The gate of transistor 74 may be coupled to power supply 58 through current source 86. A drain of transistor 76 may be coupled to power supply 58. Finally, a drain of transistor 78 may be coupled to provide an output of charge pump 10.

In operation, sink 14 may operate in one of two states according to a signal from sink control 50. If the voltage applied at the positive terminal in sink control 50 is greater than the voltage applied at the negative terminal of sink control 50, active device 70 is turned on. Active device 56 is turned off and active device 78 is turned on. Therefore, sink 14 operates in an on state wherein transistor 78 conducts a predetermined current. If, however, the voltage at the positive terminal of sink control 50 is less than the voltage at the negative terminal sink control 50, transistor 70 is turned off. Transistors 56 is on and 78 is off. Therefore, sink 14 operates to receive current equal to approximately zero amps.

Differential mode switch 18 significantly increases the speed of source 12. Each transistor 24 and 26 contains parasitic capacitance between its source and gate. If switch 18 were coupled to current mirror 16 in a singled-ended mode, this parasitic capacitance would reduce the speed at which current mirror 16 could operate. Additionally, the voltage at the gate of transistors 24 and 26 would not remain constant as the capacitance would be charged and discharged based on the signal from switch 18. By using a differential control signal from switch 18, this problem is overcome. Thereby, the gate voltage of both transistors 24 and 26 maintain approximately a constant value.

Source 12 and sink 14 operate at approximately equal speed due to current mirror 44 and switch 48 in current sink 14. As described above, current mirror 44 is substantially identical to current mirror 16 and switch 48 is substantially identical to switch 18. Therefore, each of these components operates at approximately the same speed. Second current mirror 46 of current sink 14 operates a substantially higher speed than the combination of current mirror 44 and switch 48. Therefore, source 12 and sink 14 operate at approximately the same speed.

Source 12 and sink 14 of charge pump 10 may be independently controlled. FIG. 2 illustrates the potential output of charge pump 10 based on various combinations of inputs from sink control 50 and source control 20. In FIG. 2, a 1 in the column for source control or sink control means that the voltage at the positive terminal is greater than the voltage of at the negative terminal. Additionally, a 0 means that the voltage at the positive terminal is less than the voltage at the negative terminal. Therefore, charge pump 10 may operate in four distinct states. First, charge pump 10 may operate as a current source if the source control is a 1 and the sink control is a 0. Additionally, charge pump 10 may be off if both the source control and sink control are equal to 0. Furthermore, charge pump 10 may operate as a sink if source control 20 is a 0 and sink control 50 is a 1. Finally, the output of charge pump 10 may comprise the difference between source and sink outputs if both source control 20 and sink control 50 are each equal to 1.

FIG. 3 illustrates another embodiment of a charge pump indicated generally at 10' and constructed according to the teachings of the present invention. Charge pump 10' is substantially identical to charge pump 10 of FIG. 1. The drain of active device 24 may be coupled to the drain of active device 76 so as to provide a second, or complimentary, output for charge pump 10'.

Although the present invention has been described in detail, it should be understood that various changes, substitutions and alternations can be made hereto without departing from the spirit and scope of the invention as defined by the appended claims. For example, the transistors in a current mirror may be sized so as to provide different currents in each branch of the current mirror. Alternatively, the size of each transistor in a current mirror may be approximately equal thereby providing approximately the same current in each branch of the mirror. The value of the resistors may be varied to provide an appropriate current output of charge pump 10. Finally, the resistor and transistor valves may be adjusted by known techniques to provide one or more "middle" states between the "on" and "off" states for both source 12 and sink 14.

What is claimed is:

1. A current source, comprising:

a switch coupled in a differential configuration; and a current mirror responsive to said switch, said current mirror comprising a transistor for setting a current for the current mirror, and first and second transistors for providing the output current of the current source, said transistors being coupled in a folded cascode configuration with said switch such that said switch is operable to switch current output by said current source transistors between first and second output currents.

2. The current source of claim 1, and further comprising circuitry coupled to said switch for providing a control signal to said switch to control the output of the current source.

3. The current source of claim 1, wherein each of said transistors of said current mirror have a predetermined size so as to provide predetermined first and second output currents.

4. The current source of claim 1, wherein said output of said output transistors comprises a complementary output.

5. The current source of claim 1, wherein one of said first and second output currents comprises approximately zero amperes.

6. The current source of claim 1, wherein said transistors of said current mirror comprise P-Channel MOSFET devices.

7. The current source of claim 1, wherein said switch comprises two NPN bipolar junction transistors coupled in an emitter-coupled differential configuration.

8. A charge pump, comprising:

a current source, comprising:

source circuitry operable to generate first and second current source output currents; and a current source switch, said current source switch having a differential input and being coupled to said source generating circuitry and operable to switch current output by said source generating circuitry between said first and second current source output currents such that the charge pump is operable to function as a current source; and a current sink, comprising:

sink circuitry operable to generate first and second sink output currents;

a sink switch, said current sink switch having a differential input and being coupled to said generating circuitry and operable to switch the current output by said sink generating circuitry between said first and second current sink output currents; and circuitry responsive to said first and second current sink output currents and operable to generate one of a third and fourth output current such that the charge pump is operable to function as a current sink.

9. The charge pump of claim 8, wherein said current source further comprises:

a current mirror responsive to said source switch, said source switch being coupled in a differential configuration, said current mirror comprising a transistor for setting a current for the current mirror, and first and second transistors for providing the output current of the current source, said transistors being coupled in a folded cascode configuration with said source switch such that said source switch is operable to switch current output by said current source transistors between said first and second source output currents.

10. The charge pump of claim 8, wherein said current sink comprises:

a first current mirror comprising a transistor for setting a current for the current mirror, and first and second transistors for providing an output current of said first current mirror, said current source switch being coupled to said transistors of said first current mirror so as to form a folded cascode configuration, said current source switch being coupled in an emitter-coupled differential configuration, so as to switch the current output by said first current mirror output transistors between said current source first and second output currents; and a second current mirror responsive to said first current mirror, said second current mirror comprising a transistor for setting a current for said second current mirror, and first and second transistors for providing an output current of said second current mirror, said second current mirror transistors being coupled in a folded cascode configuration with said first and second output transistors of said first current mirror.

11. The charge pump of claim 8, and further comprising circuitry coupled to said current sink and said current source for independently controlling said current sink and said current source.

12. The charge pump of claim 8, wherein each of said current source and current sink provide complementary outputs.

13. The charge pump of claim 8, wherein the output of said current source and said current sink are coupled together.

14. The charge pump of claim 8, wherein said current source comprises:

a current mirror comprising a P-Channel MOSFET transistor for setting a current for the current mirror, and first and second P-Channel MOSFET transistors for providing the output current of the current source said current source switch being coupled to said output P-Channel transistors of said current mirror to form a folded cascode configuration, said current source switch comprising two NPN bipolar junction transistors coupled in an emitter-coupled differential configuration, so as to switch current output by said current source output transistors between first and second output currents.

15. The charge pump of claim 8, wherein said current sink comprises:

a first current mirror comprising a P-Channel MOSFET transistor for setting a current for the current mirror, and first and second P-Channel MOSFET transistors for providing an output current of said first current mirror, said sink switch being coupled to said output P-Channel transistors of said first current mirror so as to form a folded cascode configuration, said sink switch comprising two NPN bipolar junction transistors coupled in an emitter-coupled differential configuration, so as to switch the current output by said first current mirror output P-Channel transistors between first and second output currents; and a second current mirror responsive to said first current mirror, said second current mirror comprising an N-Channel MOSFET transistor for setting a current for said second current mirror, and first and second N-Channel MOSFET transistors for providing an output current of said second current mirror, said N-Channel transistors being coupled in a folded cascode configuration with said output P-Channel transistors of said first current mirror.

16. The charge pump of claim 8, wherein said current source comprises:

a current mirror comprising a P-Channel MOSFET transistor for setting a current for the current mirror, and first and second P-Channel MOSFET transistors for providing a current mirror output current said current mirror switch being coupled to said current mirror output P-Channel transistors to form a folded cascode configuration, said current mirror switch comprising two NPN bipolar junction transistors coupled in an emitter-coupled differential configuration, so as to switch the current output by said current source output transistors between first and second output currents; and said current sink comprises:

a first current mirror comprising a P-Channel MOSFET transistor for setting a current for the current mirror, and first and second P-Channel MOSFET transistors for providing a first current mirror output current, said current sink switch being coupled to said output P-Channel transistors of said first current mirror so as to form a folded cascode configuration[,] said current sink switch comprising two NPN bipolar junction transistors coupled in an emitter-coupled differential configuration, so as to switch the current output by said output P-Channel transistors of said first current mirror between first and second output currents; and a second current mirror responsive to said first current mirror, said second current mirror comprising an N-Channel MOSFET transistor for setting a current for said second current mirror, and first and second N-Channel MOSFET transistors for providing an output current of said second current mirror, said N-Channel transistors being coupled in a folded cascode configuration with said output P-Channel transistors of said first current mirror.

17. A method for controlling a current source, comprising the steps of:

setting a current in a current mirror, the current mirror comprising a transistor for setting a current for the current mirror, and first and second transistors for providing one of first and second output currents;

selecting between the first and second output currents using a switch comprising first and second transistors coupled in a differential configuration and coupled to form a folded cascode configuration with the transistors of the current mirror;

outputting the first output current in response to a first predetermined control voltage; and outputting the second output current in response to a second predetermined control voltage.

18. The method of claim 17, wherein said outputting steps further comprise providing a complementary output.

19. The method of claim 17, wherein said step of outputting the first output current comprises the step of outputting a current approximately equal to zero amperes.

20. The method of claim 17, and further comprising the step of providing a control voltage to the switch, the switch comprising first and second NPN bipolar junction transistors coupled in an emitter-coupled differential configuration, so as to select between first and second predetermined output currents.

* * * * *